United States Patent [19]
Jones et al.

[11] 3,754,912
[45] Aug. 28, 1973

[54] CHEMICAL MILLING USING FUSED POWDER PARTICLES AS RESIST

[75] Inventors: Rexford W. Jones; William B. Thompson, both of Columbus, Ohio

[73] Assignee: A. E. Staley Manufacturing Company, Decatur, Ill.

[22] Filed: Sept. 27, 1971

[21] Appl. No.: 183,802

Related U.S. Application Data

[63] Continuation-in-part of Ser. No. 796,847, Feb. 5, 1969, abandoned, and a continuation-in-part of Ser. No. 833,771, June 16, 1969, Pat. No. 3,677,759, and a continuation-in-part of Ser. No. 849,520, Aug. 12, 1969, abandoned, and a continuation-in-part of Ser. No. 123,084, March 10, 1971, abandoned.

[52] U.S. Cl. .................................... 96/36, 96/48 R
[51] Int. Cl. .............................................. G03c 5/00
[58] Field of Search ......................... 96/36.1, 36, 34, 96/48 R

[56] References Cited

UNITED STATES PATENTS

| | | | |
|---|---|---|---|
| 3,637,385 | 1/1972 | Hayes et al. | 96/48 |
| 3,677,756 | 7/1972 | Protzman | 96/36 |
| 3,529,960 | 9/1970 | Sloan | 96/36 |
| 3,236,647 | 2/1966 | Phlipot | 96/34 |
| 3,060,026 | 10/1962 | Heiart | 96/27 |

*Primary Examiner*—Norman G. Torchin
*Assistant Examiner*—Edward C. Kimlin
*Attorney*—William H. Magidson and Charles J. Meyerson

[57] ABSTRACT

Method of chemical milling which comprises the steps of exposing a metal layer bearing a light-sensitive layer capable of developing a $R_d$ of 1.0 to 2.2 to actinic radiation to produce a potential $R_d$ of 1.0 to 2.2; developing said light-sensitive layer with water-insoluble powder particles using physical force to embed the powder particles in the light-sensitive layer; removing non-embedded powder particles; fusing the water-insoluble powder particles to the metal layer by heating to form a stencil; and etching through the metal layer in the areas unprotected by the fused water-insoluble powder particles.

10 Claims, No Drawings

CHEMICAL MILLING USING FUSED POWDER PARTICLES AS RESIST

This application is a continuation-in-part of application Ser. Nos. 796,897 now abandoned, 833,771 U.S. Pat. No. 3,677,759, 849,520 now abandoned, and 123,084 filed Feb. 5, 1969; June 16, 1969; Aug. 12, 1969 and Mar. 10, 1971 respectively.

This invention relates to a method of chemical milling.

Many intricate and simple metal objects are produced by chemical milling. In these processes a light-sensitive composition is applied to a relatively thin metal layer, the composition is dried to remove all the volatiles in the coating composition, the light-sensitive composition is exposed to actinic radiation to cross-link the light-sensitive composition thereby forming a resist, and the resist is used to protect the thin metal layer in the desired areas when an etchant is applied to the element. While this process has many advantages, it has the disadvantage that the light-sensitive composition must be carefully formulated. The light-sensitive composition must form an etchant resistant resist (sometimes called a stencil), the unexposed areas must be capable of easy removal and the stencil should be capable of easy removal.

In a typical situation, a thin metal layer is coated with polyvinyl cinnamate from an organic solvent and carefully dried. Failure to carefully dry the light-sensitive layer causes anomalies in its response to actinic radiation. Underdrying results in reduced light-sensitivity and overdrying results in premature crosslinking. The polyvinyl cinnamate is exposed to actinic radiation through an appropriate master thereby tanning the polyvinyl cinnamate in the exposed areas forming a temporary resist or stencil. The unexposed polyvinyl cinnamate is removed from the metal layer by carefully washing the imaged element in an organic solvent and the resultant elements heat-cured to render the polyvinyl cinnamate sufficiently impervious to be used as a resist. If the element is not sufficiently heat-cured, the polyvinyl cinnamate does not have the necessary resistance to etchant. However, the better the resist for etching purposes, the harder it is to remove the stencil. The unprotected exposed conductive metal areas are then etched through by placing the element in a suitable etchant bath. The polymerized polyvinyl cinnamate is then removed from each chemically milled part. It is readily apparent that it would be desirable to provide a method of producing printed circuits where the chemistry of the resist former is independent of its light-sensitivity.

The principal object of this invention is to provide a new method of chemical milling. Other objects will appear hereinafter.

In the description that follows, the phrase "powder-receptive, solid, light-sensitive organic layer" is used to describe an organic layer which is capable of developing a predetermined contrast or reflection density ($R_d$) upon exposure to actinic light and embedment of black powder particles of a predetermined size in a single stratum at the surface of said organic layer. While explained in greater detail below, the $R_d$ of a light-sensitive layer is a photometric measurement of the difference in degree of blackness of undeveloped areas and black power developed areas. The terms "physically embedded" or "physical force" are used to indicate that the powder particle is subject to an external force other than, or in addition to, either electrostatic force or gravitational force resulting from dusting or sprinkling powder particles on a substrate. The terms "mechanically embedded" or "mechanical force" are used to indicate that the powder particle is subjected to a manual or machine force, such as lateral to-and-fro or circular rubbing or scrubbing action. The term "embedded" is used to indicate that the powder particle displaces at least a portion of the light-sensitive layer and is held in the depression so created, i.e. at least a portion of each particle is below the surface of the light-sensitive layer.

We have now found that the object of this invention can be attained by:

1. exposing a thin metal layer bearing a light-sensitive layer capable of developing a $R_d$ of 1.0 to 2.2 to actinic radiation to produce a potential $R_d$ of 1.0 to 2.2;
2. developing said light-sensitive layer with water-insoluble powder particles using physical force to embed the powder particles in the light-sensitive layer;
3. removing non-embedded powder particles;
4. fusing the water-insoluble powder particles to the metal layer by heating to form a stencil; and
5. etching through the metal layer in the areas unprotected by the fused water-insoluble powder particles.

Since the resist or stencil produced by this process is only deposited in the desired areas, it is unnecessary to remove same prior to the etching step. Further, where the stencil is produced from a thermoplastic polymer, it can be removed easily after the etching step with an organic solvent.

For use in this invention, the solid, light-sensitive organic layer, which can be an organic material in its naturally occurring or manufactured form or a mixture of said organic material with plasticizers and/or photoactivators for adjusting the powder receptivity and sensitivity to actinic radiation, must be capable of developing a predetermined contrast or $R_d$ using a suitable black developing powder under the conditions of development. The powder-receptive areas of the layer (unexposed areas of a positive-acting light-sensitive layer or the exposed areas of a negative-acting material) must have a softness such that suitable particles can be embedded into a stratum at the surface of the light-sensitive layer by mild physical forces. However, the layer should be sufficiently hard that film transparencies can be pressed against the surface without the surfaces sticking together or being damaged even when heated slightly under high intensity light radiation. The light-sensitive layer should also have a degree of toughness so that it maintains its integrity during development. If the $R_d$ of the light-sensitive layer is below about 1.0, the light-sensitive layer is too hard to accept a suitable concentration of particles to produce a resist suitable for use in chemical milling. On the other hand, if the $R_d$ is above about 2.2, the light-sensitive layer is so soft that it is difficult to maintain film integrity during physical development. Further, if the $R_d$ is above 2.2, the light-sensitive layer is so soft that it is difficult to maintain film integrity during physical development. Further, if the $R_d$ is above 2.2, the light-sensitive layer is so soft that the layer may be displaced by mechanical forces resulting in distoration or destruction of the image. Accordingly, for use in this invention the light-sensitive layer must be capable of developing a $R_d$ within the range of 1.0 to 2.2 using a suitable black developing powder under the conditions of development.

The $R_d$ of the positive-acting, light-sensitive layer, which can be called $R_{dp}$, is a photometric measurement of the reflection density of a black powder developed light-sensitive layer after a positive-acting, light-sensitive layer has been exposed to sufficient actinic radiation to convert the exposed areas into a substantially powder-non-receptive state (clear the background). The $R_d$ of a negative-acting, light-sensitive layer, which is called $R_{dn}$, is a photometric measurement of the reflection density of a black powder developed area, after a negative-acting, light-sensitive layer has been exposed to sufficient radiation to convert the exposed area into a powder-receptive area.

In somewhat greater detail, the reflection density of the solid, positive-acting, light-sensitive layer ($R_{dp}$) is determined by coating the light-sensitive layer on a white substrate, exposing the light-sensitive layer to sufficient actinic radiation image-wise to clear the background of the solid, positive-acting, light-sensitive layer, applying a black powder (prepared from 77 percent Pliolite VTL and 23 percent Neo Spectra carbon black in the manner described below) to the exposed layer, physically embedding said black powder under the conditions of development as a monolayer in a stratum at the surface of said light-sensitive layer and removing the non-embedded particles from said light-sensitive layer. The developed organic layer containing black powder embedded image areas and substantially powder free non-image areas is placed in a standard photometer having a scale reading from 0 to 100 percent reflection of incident light or an equivalent density scale, such as on Model 500A photometer of the Photovolt Corporation. The instrument is zeroed (0 density; 100 percent reflectance) on a powder free non-image area of the light-sensitive organic layer and an average $R_d$ reading is determined from the powder developed area. The reflection density is a measure of the degree of blackness of the developed surface which is relatable to the concentration of particles per unit area. The reflection density of a solid, negative-acting, light-sensitive layer ($R_{dn}$) is determined in the same manner except that the negative-acting, light-sensitive layer is exposed to sufficient actinic radiation to convert the exposed area into a powder-receptive state.

Although the $R_d$ of all light-sensitive layers is determined by using the aforesaid black developing powder and a white substrate, the $R_d$ is only a measure of the suitability of a light-sensitive layer for use in this invention.

Since the $R_d$ of any light-sensitive layer is dependent on numerous factors other than the chemical constitution of the light-sensitive layer, the light-sensitive layer is best defined in terms of its $R_d$ under the development conditions of intended use. The positive-acting, solid, light-sensitive organic layers useful in this invention must be powder receptive in the sense that the aforesaid black developing powder can be embedded as a monoparticle layer into a stratum at the surface of the exposed layer to yield a $R_{dp}$ of 1.0 to 2.2 under the predetermined conditions of development and light-sensitive in the sense that upon exposure to actinic radiation the most exposed areas can be converted into the non-particle receptive state (background cleared) under the predetermined conditions of development. In other words, the positive-acting, light-sensitive layer must contain a certain inherent powder receptivity and light-sensitivity. The positive-acting, light-sensitive layers are apparently converted into the powder-non-receptive state by a light-catalyzed hardening action, such as photo-polymerization, photocrosslinking, photooxidation, etc. Some of these photohardening reactions are dependent on the presence of oxygen, such as the photooxidation of internally ethylenically unsaturated acids and esters while others are inhibited by the presence of oxygen, such as those based on the photopolymerization of the vinylidene groups of polyvinylidene monomers alone or together with polymeric materials. The latter require special precautions, such as storage in oxygen-free atmosphere or oxygen-impermeable cover sheets. For this reason, it is preferable to use solid, positive-acting, film-forming, organic materials containing no terminal ethylenic unsaturation.

The negative-acting, solid, light-sensitive organic layers useful in this invention must be light-sensitive in the sense that, upon exposure to actinic radiation, the most exposed areas of the light-sensitive layer are converted from a non-powder-receptive state under the predetermined conditions of development to a powder-receptive state under the predetermined conditions of development. In other words, the negative-acting, light-sensitive layer must have a certain minimum light-sensitivity and potential powder receptivity. The negative-acting, light-sensitive layers are apparently converted in the powder receptive state by a light-catalyzed softening action, such as photodepolymerization.

In general, the positive-acting, solid, light-sensitive layers useful in this invention comprise a film-forming organic material in its naturally occurring or manufactured form or a mixture of said organic material with plasticizers and/or photoactivators for adjusting powder receptivity and senitivity to actinic radiation. Suitable positive-acting, film-forming organic materials which are not inhibited by oxygen, include internally ethylenically unsaturated acids, such as abietic acid, rosin acids, partially hydrogenated rosin acids, such as those sold under the name Staybelite resin, wood rosin, etc., esters of internally ethylenically unsaturated acids, methylol amides of maleated oils such as described in U.S. Pat. No. 3,471,466, phosphatides of the class described in application Ser. No. 796,841, filed on Feb. 5, 1969 U.S. Pat. No. 3,585,031 in the name of Hayes, such as soybean lecithin, partially hydrogenated lecithin, dilinolenyl-alpha-lecithin, etc., partially hydrogenated rosin acid esters, such as those sold under the name Staybelite esters, rosin modified alkyds, etc., polymers of ethylenically unsaturated monomers, such as vinyltoluene-alpha methyl styrene copolymers, polyvinyl cinnamate, polyethyl methacrylate, vinyl acetate-vinyl stearate copolymers, polyvinyl pyrrolidone, etc.; coal tar resins, such as coumarone-indene resins, etc.; halogenated hydrocarbons, such as chlorinated waxes, chlorinated polyethylene, etc. Positive-acting, light-sensitive materials, which are inhibited by oxygen include mixtures of polymers, such as polyethylene terephthalate/sebacate, or cellulose acetate or acetate/-butyrate, with polyunsaturated vinylidene monomers, such as ethylene glycol diacrylate or dimethacrylate, tetraethylene glycol diacrylate or dimethacrylate, etc.

Although numerous positive-acting, film-forming organic materials have the requisite light-sensitivity and powder receptivity at predetermined development temperatures, it is generally preferable to compound the film-forming organic material with photoactivator(s) and/or plasticizer(s) to impart optimum powder-receptivity and light-sensitivity to the light-sensitive layer. In most cases, the light-sensitivity of an element can be increased many fold by incorporation of a suitable photoactivator capable of producing free-radicals, which catalyze the light-sensitive reaction and reduce the amount of photons necessary to yield the desired physical change.

Suitable photoactivators capable of producing free-radicals include benzil, benzoin, Michlers ketone, diacetyl, phenanthraquinone, p-dimethyl-aminobenzoin, 7,8-benzoflavone, trinitrofluorenone, desoxybenzoin, 2,3-pentanedione, dibenzylketone, nitroisatin, di(6-dimethylamino-3-pyradil) methane, metal napthanates, N-methyl-N-phenylbenzylamine, pyridil, 5-7 dichloroisatin; azodiisobutyronitrile, trinitroanisole, chlorophyll, isatin, bromoisatin, etc. These compounds can be used in a concentration of .001 to 2 times the weight of the film-forming organic material 0.1–200 percent the weight of the film former). As in most catalytic systems, the best photo-activator and optimum concentration thereof is dependent upon the film-forming organic material. Some photoactivators respond better with one type of film former and may be useful over rather narrow concentration ranges whereas others are useful with substantially all film-formers in wide concentration ranges.

The acyloin and vicinal diketone photoactivators, particularly benzil and benzoin are preferred. Benzoin and benzil are effective over wide concentration ranges with substantially all film-forming light-sensitive organic materials. Benzoin and benzil have the additional advantage that they have a plasticizing or softening effect on film-forming, light-sensitive layers, thereby increasing the powder receptivity of the light-sensitive layers. When employed as a photoactivator, benzil should preferably comprise at least 1 percent by weight of the film-forming organic mateiral (.01 times the film former weight).

Dyes, optical brighteners and light absorbers can be used alone or preferably in conjunction with the aforesaid free-radical producing photoactivators (primary photoactivators) to increase the light-sensitivity of the light-sensitive layers of this invention by converting light rays into light-rays of longer lengths. For convenience, these secondary photoactivators (dyes, optical brightreners and light absorbers) are called "superphotoactivators". Suitable dyes, optical brighteners and light-absorbers incluce 4-methyl-7-dimethylaminocoumarin, Calcofluor yellow HEB (preparation described in U.S. Patent 2,415,373), Calcofluor white SB super 30080, Calcofluor, Uvitex W conc., Uvitex TXS conc., Uvitex RS (described in Textil-Rundschau 8[1953], 339), Uvitex WGS conc., Uvitex K, Uvitex CF conc., Uvitex W (described in Textil-Rundschau 8 [1953], 340), A clarat 8678, Blancophor OS. Tenopol UNPL, MDAC S-8844, Uvinul 400, Thilflavin TGN conc., Aniline yellow - S (low conc.)., Seto flavine T 5506-140, Auramine O, Calcozine yellow OX, Calcofluor RW, Calcofluor GAC, Acetosol yellow 2 RLS-PHF, Eosin bluish, Chinoline yellow - P conc., Ceniline yellow S (high conc.), Anthracene blue Violet fluorescence, Calcofluor white MR, Tenopol PCR, Uvitex GS, Acid-yellow-T-supra, Acetosol yellow 5 GLS, Calcocid OR, & Ex. Conc., diphenyl brilliant flavine 7 GFF, Resoflorm fluorescent yellow 3 CPI, Eosin yellowish, Thiazole fluorescor G, Pyrazalone organe YB-3, and National FD&C yellow. Individual super-photo-activators may respond better with one type of light-sensitive organic film-former and photoactivator than with others. Further, some photo-activators function better with certain classes of brighteners, dyes and light absorbers. For the most part, the most advantageous combinations of these materials and proportions can be determined by simple experimentation.

As indicated above, plasticizers can be used to impart optimum powder receptivity to the light-sensitive layer. With the exception of lecithin, most of the film-forming, light-sensitive organic materials useful in this invention are now powder-receptive at room temperature but are powder-receptive above room temperature. Accordingly, it is desirable to add sufficient plasticizer to impart room temperature (15° to 30°C) or ambient temperature powder receptivity to the light-sensitive layers and/or broaden the $R_{dp}$ range of the light-sensitive layers.

While various softening agents, such as dimethyl siloxanes, dimethyl phthalate, glycerol, vegetable oils, etc. can be used as plasticizers, benzil and benzoin are preferred since, as pointed out above, these materials have the additional advantage that they increase the light-sensitivity of the film-forming organic materials. As plasticizers-photoactivators, benzoin and benzil are preferably used in a concentration of 10 to 80 percent by weight of the film-forming solid organic material.

The preferred positive-acting, light-sensitive film formers containing no conjugated terminal ethylenic unsaturation include the esters and acids of internally ethylenically unsaturated acids, particularly the phosphatides, rosin acids, partially hydrogenated rosin acids and the partially hydrogenated rosin esters. These materials, when compounded with suitable photoactivators, preferably acyloins or vicinal diketones together with superphotoactivators are relatively fast and can be developed to yield waterinsoluble powder resist patterns having the desired configuration.

In general, the negative-acting, light-sensitive layers useful in this invention comprise a film-forming organic material in its naturally occurring or manufactured form, or a mixture of said organic material with plasticizers and/or photoactivators for adjusting powder receptivity and sensitivity to actinic radiation. Suitable negative-acting, film-forming organic materials include n-benzyl linoleamide, dilinoleyl-alpha-lecithin, castor wax (gylcerol 12-hydroxy-stearate), ethylene glycol monohydroxy, stearate, polyisobutylene, polyvinyl stearate, etc. Of these, castor wax, and other hydrogenated ricinoleic acid esters (hydroxystearate) are preferred. These materials can be compounded with plasticizers and/or photoactivators in the same manner as the positive-acting, light-sensitive, film-forming organic materials.

In somewhat greater detail, water-insoluble image areas are produced by applying a thin layer of solid, light-sensitive, film-forming organic material having a potential $R_d$ of 1.0 to 2.2 (i.e. capable of developing a $R_{dp}$ or $R_{dn}$ of 1.0 to 2.2) to a relatively thin (0.0001 mil to 10.0 mil) metal layer by any suitable means dictated by the nature of the film-forming organic material and- /or the base (hot melt, draw down, spray, roller coating or air knife, flow, dip, curtain coating, etc.) so as to produce a reasonably smooth homogeneous layer of from 0.1 to 10 microns thick employing suitable solvents as necessary. Suitable metal layers include copper, chromium, nickel, aluminum, silver, etc.

The light-sensitive layer must have an average thickness of at least 0.1 micron thick, and preferably at least 0.4 micron, in order to hold water-insoluble powders during development. If the light-sensitive layer is less than 0.1 micron, or the powder diameter is more than 25 times layer thickness, the light-sensitive layer does not hold the powder with the necessary tenacity. In general, as layer thickness increases, the light-sensitive layer is capable of holding larger particles. However, as the light-sensitive layer thickness increases, it becomes increasingly difficult to maintain film integrity during development. The light-sensitive layer should have an average thickness of between 0.1 and 10 microns.

The light-sensitive layers of predetermined thickness are preferably applied to the base from an organic solvent (hydrocarbon, such as hexane, heptane, benzene, etc.; halogenated hydrocarbon, such as chloroform, carbon tetrachloride, 1,1,1-trichloroethane, trichloroethylene, etc.). If desired, the light-sensitive layers can be deposited from suitable aqueous emulsions. The thickness of the light-sensitive layer can be varied as a function of the concentration of the solids dissolved in the solvent.

After the metal layer is coated with a suitable solid, light-sensitive organic layer, a latent image is formed by exposing the element to actinic radiation in image-receiving manner in predetermined areas corresponding to an optical pattern for a time sufficient to provide a potential $R_d$ of 1.0 to 2.2. The light-sensitive elements can be exposed to actinic light through a continuous tone, half-tone or line image.

As indicated above, the latent images are preferably produced from positive-acting, light-sensitive layers by exposing the element in image-receiving manner for a time sufficient to clear the background, i.e. render the exposed areas non-powder-receptive. As explained in commonly assigned application Ser. No. 796,897, which is incorporated by reference, the amount of actinic radiation necessary to clear the background varies to some extent with developer size and development conditions. Due to these variations it is often desirable to slightly overexpose both positive and negative-acting, light-sensitive elements.

After the light-sensitive element is exposed to actinic radiation for a time sufficient to clear the background of the positive-acting, light-sensitive layer or establish a potential $R_{dn}$ of 1.0 to 2.2, a water-insoluble resin powder is applied to the light-sensitive layer. The developing powder, which has a diameter or dimension along one axis of at least 0.3 micron, is applied physically with a suitable force, preferably mechanically, to embed the powder in the light-sensitive layer. The developing powder can be virtually any shape, such as spherical, acicular, platelets, etc., provided it has a diameter along at least one axis of at least 0.3 micron.

Suitable water-insoluble, resinous powders include Vinylite VMCH (vinyl chloride-vinyl acetate-maleic anhydride), phenol-formaldehyde resins, epoxy resins, polyamide (nylon) resins, polystyrene resins, acrylic resins, vinyl toluene-butadiene resins, etc. If desired these resinous powders can be pigmented.

The black developing powder for determining the $R_d$ of a light-sensitive layer, which can also be employed as a suitable light-absorbing pigment in this invention is formed by heating about 77 percent Pliolite VTL (vinyltoluene-butadiene copolymer) and 23 percent Neo Spectra carbon black at a temperature above the melting point of the resinous carrier, blending on a rubber mill for fifteen minutes and then grinding in a Mikro-atomizer.

The developing powders useful in this invention contain particles having a diameter or dimension along at least one axis from 0.3 to 25 microns, preferably 0.5 to 10 microns, with powder of the order of 1 to 15 microns being best for light-sensitive layers of 0.4 to 10 microns. Maximum particle size is dependent on the thickness of the light-sensitive layer while minimum particle size is independent of layer thickness. Electron microscope studies have shown that powders having a diameter 25 times the thickness of the light-sensitive layer cannot be permanently embedded into light-sensitive layers, and generally speaking, best results are obtained where the diameter of the powder particles is less than about 10 times the thickness of the light-sensitive layer. For the most part, particles over 25 microns are not detrimental to image development provided the developing powder contains a reasonable concentration of powder particles under 25 microns, which are less than 25 times, and preferably less than 10 times, the light-sensitive layer thickness.

Although developing powders over 25 microns are not detrimental to image development, the presence of particles under 0.3 micron diameter along all axes can be detrimental. In general, it is preferable to employ developing powders having substantially all powders having a diameter along at least one axis not less than 0.3 micron, preferably more than 0.5 micron, since particles less than 0.3 micron tend to embed in non-image areas. As the particle size of the smallest powder in the developer increases, less exposure to actinic radiation is required to clear the background.

For best results, the developing powder should have substantially all particles (at least 95 percent by weight) over 1 micron in diameter along one axis and preferably from 1 to 15 microns for use with light-sensitive layers having an average thickness of from 0.4 to 10 microns. In this way, powder embodiment in image areas is maximum.

In somewhat greater detail, the developing powder is applied directly to the light-sensitive layer, while the powder receptive areas of said layer are in at most only a slightly soft condition and said layer is at a temperature below the melting point of the layer and powder. The powder is distributed over the area to be developed and physically embedded into the stratum at the surface of the light-sensitive layer, preferably mechanically by force having a lateral component, such as to-and-fro and/or circular rubbing or scrubbing action using a soft pad, fine brush, etc. If desired, the powder may be applied separately or contained in the pad or brush. The quantity of powder is not critical provided there is an excess available beyond that required for full development of the area, as the development seems to depend primarily on particle-to-particle interaction rather than brush-to-surface or pad-to-surface forces to embed a layer of powder particles substantially one particle thick (monoparticle layer) into a stratum at the surface of the light-sensitive layer. Only a single stratum of powder particles penetrates into the powder-receptive areas of the light-sensitive layer even if the light-sensitive layer is several times thicker than the developer particle diameter.

The pad or brush used for development is critical only to the extent that it should not be so stiff so as to scratch or scar the film surface when used with moderate pressure with the preferred amount of powder to develop the film. Ordinary absorbent cotton loosely compressed into a pad about the size of a baseball and weighing about 3 to 6 grams is especially suitable. The developing motion and force applied to the pad during development is not critical. The speed of the swabbing action is not critical other than that it affects the time required; rapid movement requiring less time than slow. The preferred mechanical action involved is essentially the lateral action applied in ultrafine finishing of a wood surface by hand sanding or steel wooling.

Hand swabbing is entirely satisfactory, and when performed under the conditions described above, will reproducibly produce the maximum density which the material is capable of achieving. That is, the maxikum concentration of particles per unit area will be deposited under the prescribed conditions, dependent upon the physical properties of the material such as softness, resiliency, plasticity, and cohesivity. Substantially the same results can be achieved using a mechanical device for the powder application. A rotating or rotating and oscillating, cylindrical brush or pad may be used to provide the described brushing action and will produce a substantially similar end result.

After the application of developing powder, excess powder remains on the surface which has not been sufficiently embedded into, or attached to, the base. This may be removed in any convenient way, as by wiping with a clean pad or brush usually using somewhat more force than employed in mechanical development, by vacuuming, by vibrating, by air doctoring, by air jets, etc., and recovered. For simplicity and uniformity of results, the excess powder usually is blown off using an air gun having an air-line pressure of about 20 to 40 psi. The gun is preferably held at an angle of about 30° to 60° to the surface at a distance of 1 to 12 inches (3 to 8 preferred). The pressure at which the air impinges on the surface is about 0.1 to 3, and preferably about 0.25 to 2, pounds per square inch. Air cleaning may be applied for several seconds or more until no additional loosely held particles are removed. The remaining powder should be sufficiently adherent to resist removal by moderately forceful wiping or other reasonably abrasive action.

The water-insoluble powder image can be converted into a resist or stencil suitable for use in the etching step by one of two techniques. On the one hand, the water-insoluble developing powder particles can be fused to the surface of the metal layer by heat (preferably at about 250° to 500°F.) and the residual light-sensitive material remaining in the non-image areas removed during the etching of the metal layer. On the other hand, the water-insoluble powder particles can be either fused or sintered to the surface of the metal layer using either heat or solvent vapors. In this case, the residual light-sensitive material remaining in the non-image areas is removed with a solvent, which is a poor solvent for the remaining (fused or sintered) water-insoluble powder image. If the water-insoluble developing powder was merely sintered by heat or solvent vapor or fused with solvent vapors, it is necessary to heat fuse the powder particles on the metal layer to form the resist or stencil for the etching step. If the water-insoluble resist had been fused by heat prior to the removal of the light-sensitive layer from the non-image areas, it may be desirable to refuse the powder particles with heat in order to remove any occluded solvent from the powder particles thereby enhancing the resistance of the stencil to the etchant.

The metal layer bearing the water-insoluble resist is then treated with an appropriate aqueous etchant to etch through the metal in the unprotected areas. Any of those etchants currently sold for this purpose may be used, such as cadmium-catalyzed hydrochloric acid solution for chromium layers; ferric nitrate for copper layers, etc.

The water-insoluble stencil, preferably comprising a thermoplastic polymer, can then be readily removed with an organic solvent. For example, vinyltoluene-butadiene polymers can be removed with Chlorothene or Cellosolve, vinyl acetate-vinyl chloride copolymers can be removed with Cellosolve, etc. The particular solvent to be employed can be determined by routine testing.

The following examples are merely illustrative and should not be construed as limiting the scope of this invention.

EXAMPLE I

A 0.25 mil copper layer is flow coated with a solution comprising 1.0 gram Staybelite Ester No. 10 (partially hydrogenated rosin ester of glycerol). 0.3 gram benzil and 0.3 gram 4-methyl-7-dimethylaminocoumarin, dissolved in 100 mls. Chlorothene (1,1,1-trichloroethane) and air dried. The sensitized metal layer is placed in contact with a master in a vacuum frame equipped with a mercury vapor point light source, and is exposed to light for 1 minute. The image is developed with Pliolite VTL (vinyl-toluene-butadiene) polymer of about 1 to 15 microns in diameter using physical force embedding the powder into the unexposed areas and non-embedded powder is removed by blowing with air and wiping with a pad. The plate is heat fused in an oven at 177°C. for 2 minutes and the light-sensitive coating in the non-image areas removed by flushing and wiping with isopropanol. After the metal is refused in the oven at 177°C. for 2 minutes, the copper layer in the unprotected areas is removed by swabbing with a soluton of about 30 grams ferric nitrate in 100 mls. water and rinsed with water removing the copper from the unprotected areas thereby liberating the chemically milled part. The stencil is then removed by flushing the Chlorothene.

Essentially the same results are obtained by replacing the Staybelite ester composition described above with (1) 1.2 grams Staybelite Ester No. 5 (partially hydrogenated rosin ester of glycerol), 0.20 gram benzil and 0.45 gram 4-methyl-7-dimethylaminocoumarin, dissolved in 100 mls. Chlorothene, (2) 1.2 grams Staybelite resin F (partially hydrogenated rosin acid), .10 gram benzil and 0.30 gram 4-methyl-7-dimethylaminocoumarin, dissolved in 100 mls. Chlorothene, (3) 1.2 grams wood rosin, 0.15 gram benzil and .45 gram 4-methyl-7-diethylaminocoumarin, dissolved in 100 mls. Chlorothene, and (4) 1.2 gram Chlorowax 70 LMP, 0.30 gram benzil and 0.30 gram 4-methyl-7-dimethylaminocoumarin, dissolved in 100 mls. Chlorothene.

EXAMPLES II

Example I is repeated with essentially the same results except that the Pliolite VTL is replaced with Vinylite VMCH (vinyl chloride-vinyl acetate maleic anhydride) of about 1 to 15 microns in diameter and the fused Vinylite VMCH removed with Cellosolve.

EXAMPLE III

Example II is repeated with essentially the same results except that the isopropanol in the sensitizer washoff step is replaced with Chlorothene.

EXAMPLE IV

Example I is a repeated with essentially the same results except that the wash-off of the light-sensitive coating in the unprotected areas with isopropanol is omitted and the second fusing step is omitted.

EXAMPLE V

When Example I is repeated replacing the positive-acting sensitizer composition with a negative-acting light-sensitive composition comprising 2.25 gram Paracin 15 (ethylene glycol monohydroxy stearate), 0.3 gram benzil and 0.3 gram 4-emthyl-7-dimethylaminocoumarin dissolved in 100 mls. of Chloroethane, essentially the same results are obtained.

EXAMPLE VI

When Example I is repeated replacing the copper layer with a 0.1 mil. chromium layer and the etchant replaced iwth cadmium-catalyzed hydrochloric acid, essentially the same results are obtained.

Since many embodiments of this invention may be made and since many changes may be made in the embodiments described, the foregoing is to be interpreted as illustrative only and this invention is defined by the claims appended hereafter.

What is claimed is:

1. The method of chemical milling which comprises the steps of:

1. exposing a metal layer bearing a light-sensitive layer capable of developing a $R_d$ to 1.0 to 2.2 to actinic radiation to produce a potential $R_d$ of 1.0 to 2.2;
2. developing said light-sensitive layer with water-insoluble, resinous powder particles using physical force to embed the powder particles in the light-sensitive layer;
3. removing non-embedded powder particles;
4. fusing the water-insoluble powder particles to the metal layer by heating to form a stencil; and
5. etching through the metal layer in the areas unprotected by the fused water-insoluble powder particles.

2. The method of chemical milling comprising of the steps of:

1. exposing a metal layer bearing a positive-acting, light-sensitive layer capable of developing a $R_{dp}$ of 1.0 to 2.2 to actinic radiation through a master to produce a potential $R_{dp}$ of 1.0 to 2.2;
2. developing said light-sensitive layer with water-insoluble, resinous powder particles using physical force to embed the powder particles as a monolayer in the light-sensitive layer;
3. removing non-embedded powder particles;
4. fusing the water-insoluble powder particles to the metal layer by heating to form a stencil; and
5. etching through the metal layer in the area unprotected by the fused water-insoluble powder particles.

3. The process of claim 2, wherein the light-sensitive layer in the exposed areas is removed from the metal layer with a poor solvent for the remaining powder particles after the non-embedded powder particles are removed from the non-image areas.

4. The process of claim 2, wherein the water-insoluble powder particles are fused or sintered to the metal layer and the light-sensitive layer in the exposed areas is removed from the metal layer with a poor solvent for the remaining powder particles after step 3 and before step 4.

5. The process of claim 2, wherein said positive-acting, light-sensitive layer comprises a film former selected from the group consisting of internally ethylenically unsaturated acids and internally ethylenically unsaturated acid esters.

6. The process of claim 5, wherein said ethylenically unsaturated acid moiety comprises a rosin acid moiety.

7. The process of claim 5, wherein said light-sensitive layer comprises a photoactivator selected from the group consisting of acyloins and vicinal diketones.

8. The process of claim 2, wherein said resinous powder particles comprise a thermoplastic polymer.

9. The process of claim 8, wherein said stencil is removed with an organic solvent after step 5.

10. The method of chemical milling comprising the steps of:

1. exposing a metal layer bearing a negative-acting, light-sensitive layer capable of developing a $R_{dn}$ of 1.0 to 2.2 to actinic radiation through a master to produce a potential $R_{dn}$ of 1.0 to 2.2; ;
2. developing said light-sensitive layer with water-insoluble, resinous powder particles using physical force to embed the powder particles as a monolayer in the light-sensitive layer;
3. removing non-embedded powder particles;
4. fusing the water-insoluble powder particles to the metal layer by heating to form a stencil; and
5. etching through the metal layer in the areas unprotected by the fused water-insoluble powder particles.

* * * * *

CERTIFICATE OF CORRECTION

PATENT NO. : 3,754,912

DATED : August 28, 1973

INVENTOR(S) : Rexford W. Jones and William B. Thompson

It is certified that error appears in the above-identified patent and that said Letters Patent are hereby corrected as shown below:

On the cover page, under "Related U. S. Application Data" for "796,847, Feb. 5, 1969, abandoned" read ---796,897, February 5, 1969, abandoned---
Column 1, line 23, for "etchant resistant" read ---etchant-resistant---
Column 1, line 39, for "elements heat" read ---elements are heat---
Column 2, line 41, for "powder receptivity" read ---powder-receptivity---
Column 2, bridging lines 62/66, for "development. Further, if the $R_d$ is above 2.2, the light-sensitive layer is so soft that it is difficult to maintain film integrity during physical development. Further, if the $R_d$ is above 2.2, the light-sensitive layer is so soft that the layer may be displaced" read ---development. Further, if the $R_d$ is above 2.2, the light-sensitive layer is so soft that the layer may be displaced---
Column 2, line 67, for "distoration" read ---distortion---
Column 3, line 32, for "powder embedded" read ---powder-embedded---
Column 3, line 33, for "powder free" read ---powder-free---
Column 3, line 38, for "powder free" read ---powder-free---
Column 3, line 61, for "powder receptive" read ---powder-receptive---
Column 4, line 3, for "powder receptivity" read ---powder-receptivity---
Column 4, line 30, for "powder receptivity" read ---powder-receptivity---
Column 4, line 32, for "powder receptive" read ---powder-receptive---
Column 4, bridging lines 39/40, for "powder receptivity" read ---powder-receptivity---
Column 5, line 3, for "powder receptivity" read ---powder-receptivity---
Column 5, line 19, for "pyradil" read ---pyridyl---
Column 5, line 19, for "napthanates" read ---naphthenates---
Column 5, line 20, for "pyridil" read ---pyradil---
Column 5, line 20, for "5-7 di" read ---5,7 di---
Column 5, line 24, for "material 0.1" read ---material (.1---
Column 5, line 27, for "is" read ---are---
Column 5, line 29, for "film former" read ---film-former---
Column 5, line 36, for "forming light" read ---forming, light---

UNITED STATES PATENT AND TRADEMARK OFFICE

CERTIFICATE OF CORRECTION

PATENT NO. : 3,754,912

DATED : August 28, 1973

INVENTOR(S) : Rexford W. Jones and William B. Thompson

It is certified that error appears in the above-identified patent and that said Letters Patent are hereby corrected as shown below:

Column 5, page 40, for "powder receptivity" read ---powder-receptivity---
Column 5, line 43, for "mateiral" read ---material---
Column 5, line 52, for "brightreners" read ---brighteners---
Column 5, line 61, for "A clarat" read ---Aclarat---
Column 5, lines 63/64, for "Thilflavin" read ---thioflavine---
Column 5, line 64, for "Aniline" read ---aniline---
Column 5, lines 64/65, for "Seto flavine" read ---Setoflavine---
Column 5, line 66, for "Eosin" read ---eosine---
Column 5, line 67, for "Anthracene blue Violet" read ---anthracene blue violet--
Column 6, line 2, for "Acid" read ---acid---
Column 6, line 4, for "Resoflorm" read ---Resoform---
Column 6, line 4, for "Eosin" read ---eosine---
Column 6, line 5, for "Thiazole fluorescor G" read ---thiazole Fluorescor G---
Column 6, line 5, for "Pyrazalone organe" read ---Pyrazolone orange---
Column 6, line 15, for "powder receptivity" read ---powder-receptivity---
Column 6, line 18, for "now" read ---not---
Column 6, line 22, for "powder receptivity" read ---powder-receptivity---
Column 6, line 43, for "waterinsoluble" read ---water-insoluble---
Column 6, bridging lines 49/50, for "powder receptivity" read ---powder-receptivity---
Column 6, line 67, for "and-/or" read ---and/or---
Column 7, line 43, for "796,896, which" read ---796,897, now abandoned, which---
Column 8, line 28, for "which are" read ---and---
Column 8, line 28, for "times, and preferably" read ---times, preferably---
Column 8, line 47, for "embodiment" read ---embedment---
Column 8, line 51, for "powder receptive" read ---powder-receptive---
Column 9, line 22, for "maxikum" read ---maximum---
Column 9, line 26, for "cohesivity" read ---cohesiveness---
Column 10, line 38, for "mercury vapor point light" read ---mercury-vapor-light point---
Column 10, line 44, for "heat fused" read ---heat-fused---
Column 11, line 3, for "Examples" read ---Example---
Column 11, line 9, for "VMCH removed" read ---VMCH is removed---

UNITED STATES PATENT AND TRADEMARK OFFICE

CERTIFICATE OF CORRECTION

PATENT NO. : 3,754,912

DATED : August 28, 1973

INVENTOR(S) : Rexford W. Jones and William B. Thompson

It is certified that error appears in the above-identified patent and that said Letters Patent are hereby corrected as shown below:

Column 11, line 12, for "results except that" read ---results, with---
Column 11, line 13, for "step is replaced" read ---step replaced---
Column 11, line 27, for "4-emthyl" read ---4-methyl---
Column 11, line 34, for "iwth" read ---with---
Column 11, line 45, for "to 1.0 to 2.2" read ---of 1.0 to 2.2---
Column 12, line 28, for "film former" read ---film-former---

Signed and Sealed this

*twenty-seventh* Day of *April 1976*

[SEAL]

*Attest:*

RUTH C. MASON
*Attesting Officer*

C. MARSHALL DANN
*Commissioner of Patents and Trademarks*